(12) United States Patent  (10) Patent No.: US 6,750,416 B1
Maierhofer et al.  (45) Date of Patent: Jun. 15, 2004

(54) INSTRUMENT FOR MEASURING AND SORTING RESISTORS AND METHOD THEREFOR

(75) Inventors: Anton Maierhofer, Neuseiersberg (AT); Gerhard Maitz, Graz (AT); Herbert Ritter, Heiligenkreuz am Waasen (AT)

(73) Assignee: M&R Automatisierung von Industrieanlagen, Feldkirchen (AT)

( * ) Notice: Subject to any disclaimer, the term of this patent is extended or adjusted under 35 U.S.C. 154(b) by 0 days.

(21) Appl. No.: 09/462,826

(22) PCT Filed: Jul. 20, 1998

(86) PCT No.: PCT/AT98/00175

§ 371 (c)(1),
(2), (4) Date: May 1, 2000

(87) PCT Pub. No.: WO99/05535

PCT Pub. Date: Feb. 4, 1999

(30) Foreign Application Priority Data

Jul. 22, 1997 (AT) .................................... 1241/97

(51) Int. Cl.⁷ ............................................. B07C 5/344
(52) U.S. Cl. .................. 209/574; 209/559; 209/560; 209/571; 209/573; 209/932
(58) Field of Search ................ 209/559, 560, 209/571, 573, 574, 932

(56) References Cited

U.S. PATENT DOCUMENTS 5,617,945 A * 4/1997 Takahashi et al. ....... 198/471.1

6,163,000 A * 12/2000 Huang .................... 209/574

FOREIGN PATENT DOCUMENTS

| DE | 15 41 885 | 10/1969 |
|----|-----------|---------|
| JP | 03 130675 A | 6/1991 |
| JP | 05 206232 A | 8/1993 |

OTHER PUBLICATIONS

Patent Abstracts of Japan, Japanese Patent No. 03 130675.
Patent Abstracts of Japan, Japanese Patent No. 05 206232.

* cited by examiner

*Primary Examiner*—Donald P. Walsh
*Assistant Examiner*—Mark J Beauchaine
(74) *Attorney, Agent, or Firm*—Alston & Bird LLP

(57) ABSTRACT

The invention describes a method for measuring and classifying resistors (2), in which in a measuring station (3) the resistance value of the resistor (2) supplied by a feed and transport device (12) of the measuring station (3) is measured. The measured resistance value is transmitted to an evaluation unit (40) of a control device (20). The resistor (2) is delivered sorted according to predetermined measurement ranges into an output device (25) arranged after the measuring station (3). The resistor (2) is heated to a predefined nominal temperature by a temperature regulating device (7), in particular by a medium (9). After reaching this nominal temperature the resistor (2) is contacted in the medium (9). Afterwards the measurement of the resistor (2) is carried out.

20 Claims, 4 Drawing Sheets

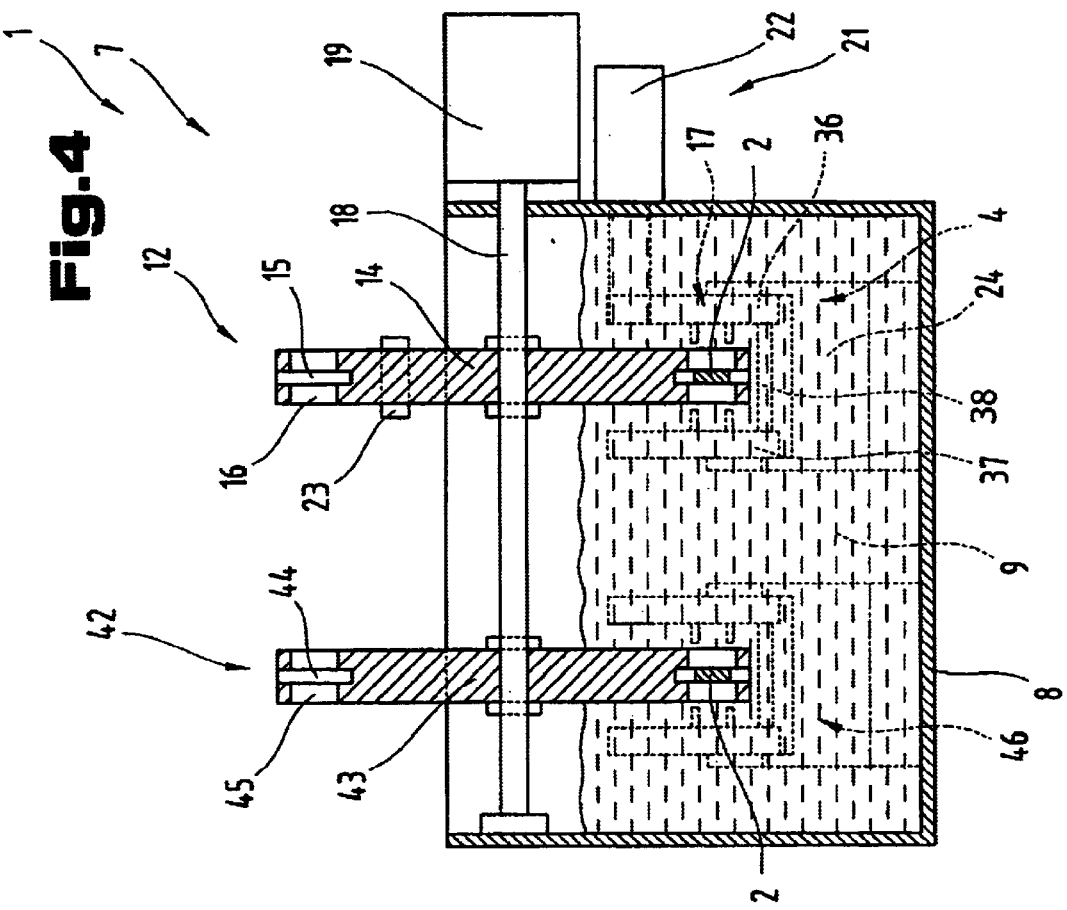
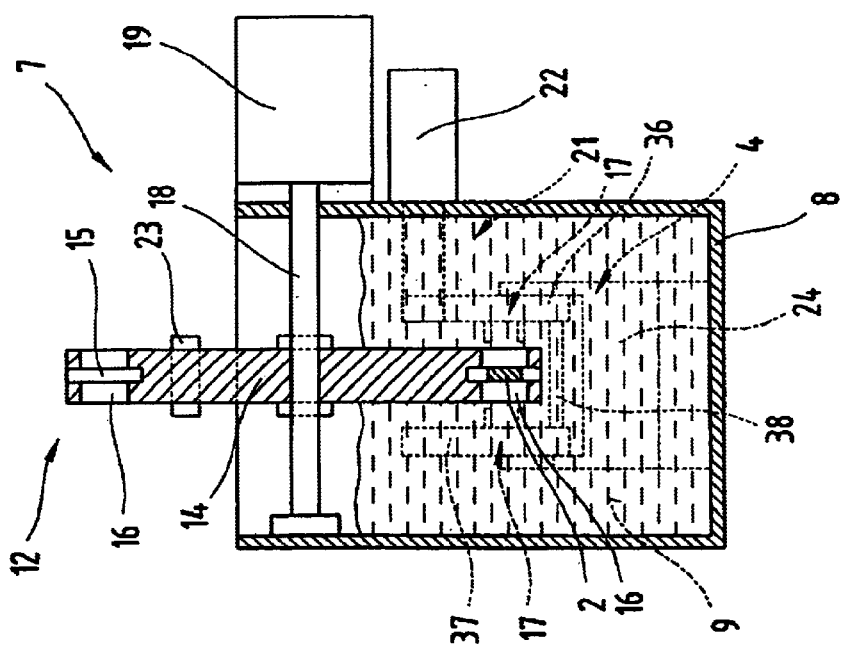

INSTRUMENT FOR MEASURING AND SORTING RESISTORS AND METHOD THEREFOR

FIELD OF THE INVENTION

The invention relates to a measuring and sorting arrangement for measuring and sorting resistors.

BACKGROUND OF THE INVENTION

Measuring and sorting arrangements are already known in which a resistor is transported by a feed and transport device to a measuring station. The measuring station comprises a holding device for contacting the resistor and a measuring device for detecting the resistance value of the resistor. So that the resistor can be measured at a nominal temperature the measurement takes place in an air-conditioned chamber. For this the chamber is heated to a predetermined nominal temperature. The disadvantage of such a measuring and sorting arrangement is that to measure the resistance value at a predetermined nominal temperature the cost of air-conditioning the chamber is high as external influences such as for example air humidity have to be compensated.

In JP 05-206232 a testing device for semiconductors devices is described in which an IC is arranged on a feed device and fed via an assembly robot is delivered to a disc-shaped rotary table and by the rotary table is inserted into a temperature regulating chamber. A medium is inserted ito the temperature regulating chamber and the temperature is regulated for each test run. The IC which has been transported is heated or cooled by a pretemperature regulating device which is arranged in the temperature regulating chamber, whilst an IC waits for the command for arrangement on the contact base. The temperature of the IC is then adjusted to a specific value and the IC is tested in this state. Thus the adjustment temperature can be reached with great precision and the adjustment time for environmental conditions can be reduced at the starting point of the testing procedure.

The disadvantage of this is that in the temperature regulating device there is no measuring station, so that the IC to be measured has to be removed from the temperature regulating device for performing the measurement, which has a negative effect on the measurement.

From JP 03-130675 a testing device for ICs is known which comprises an insulating tank filled with liquid. An IC to be checked is placed onto a base of an assembly plate which is immersed in a rotary movement in the temperature controlled liquid. In the liquid tank there is a measuring cable with high precision by which the temperature characteristics can be monitored.

The disadvantage of this checking device is that the position of the checked IC cannot be found, which makes sorting of the ICs very difficult.

Lastly, in DE 15 41 885 A a device is described for measuring and sorting electrical components, whereby a transport disc is provided with notches on its circumference for mounting components and the contacting of these components is performed via contact loops, and a sorting flap determines the route of "good" and "bad" components.

The device also does not have a zero point device for detecting the position which is disadvantageous with respect to the sorting process.

The objective of the invention is to provide a measuring and sorting arrangement for measuring and classifying resistors in which the measurement of the resistor takes place at a nominal temperature without great expense and the sorting process is simplified.

SUMMARY OF THE INVENTION

The objective of the invention is achieved by arranging the measuring station, and in particular by arranging the holding device, so that the measurement is carried out with the resistor disposed in the temperature regulating device, and in particular in the medium. In this way, an exact measurement of the resistor is achieved at nominal temperature without great expense. A further unforeseeable advantage is that by using a zero point device for determining the position of the resistor a precise allocation of the measurement result to the respective resistor is possible, whereby the sorting is considerably simplified.

Preferably, in accordance with the invention, the resistor can be measured at nominal temperature and the control or regulation of the nominal temperature is performed by means of a liquid medium, so that external influences such as air humidity, etc., need not be taken into account.

BRIEF DESCRIPTION OF THE DRAWINGS

The invention is explained in more detail with reference to the embodiments illustrated in the drawings.

Shown are:

FIG. 3 a front elevation of the temperature regulating device of the measuring and sorting arrangement according to the invention, in cross section and in simplified, schematic view;

FIG. 4 an embodiment of the temperature regulating device of the measuring and sorting arrangement of the invention in a simplified, schematic view and in front elevation, in cross section;

DETAILED DESCRIPTION OF PREFERRED EMBODIMENTS

First of all it is noted that in the various embodiments described the same parts are designated by the same reference numbers or same component names, whereby the disclosures contained throughout the description can be applied to be same parts with the same reference numbers or same component names. Also the position details used in the description, such as e.g. top, bottom, side etc. are relative to the currently described and illustrated Figure and where there has been a change in position should be transposed to the new position. Furthermore, individual characteristics of the different embodiments shown can represent independent solutions according to the invention.

Figure 1:
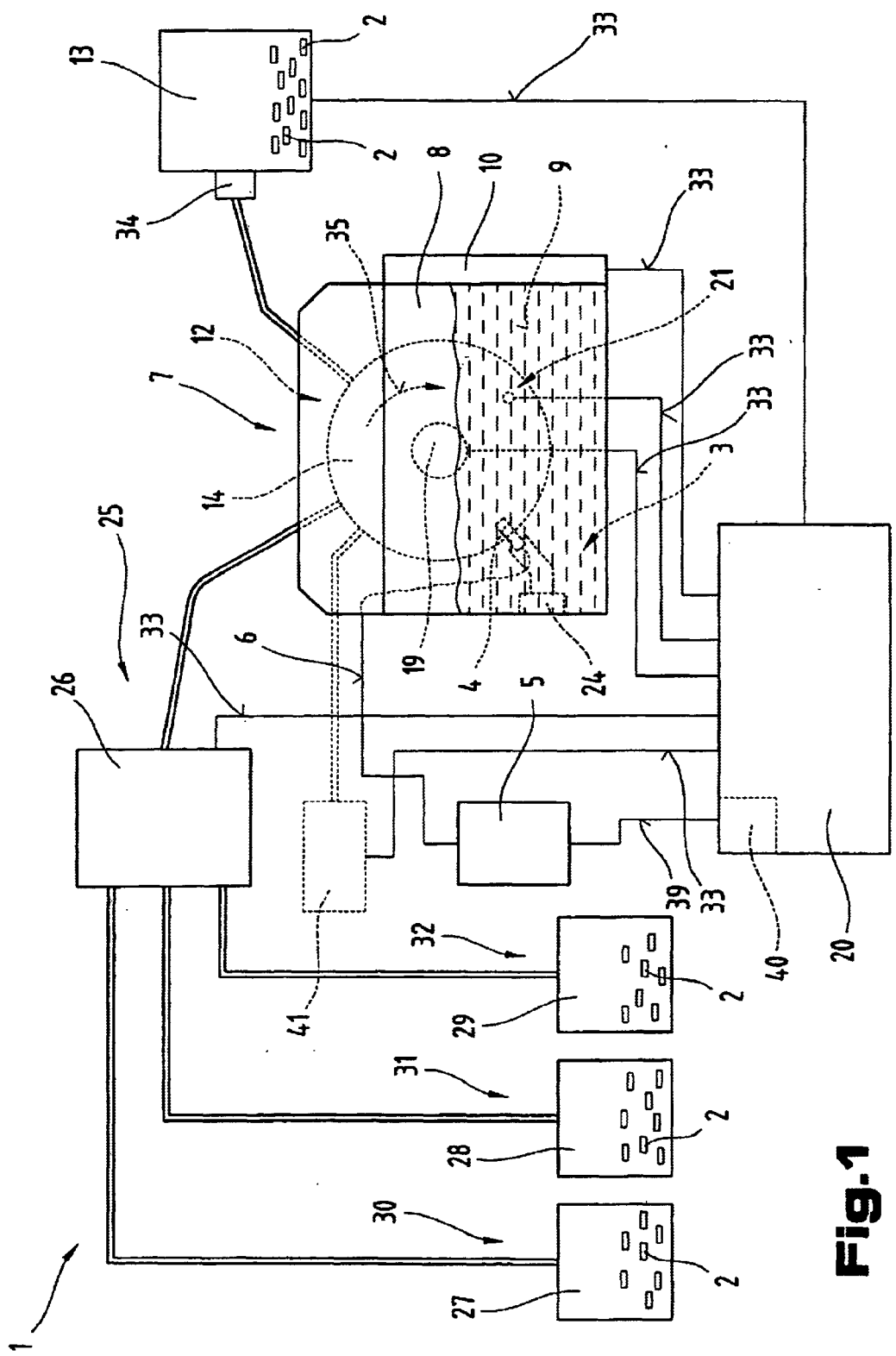
FIG. 1 a measuring and sorting arrangement according to the invention in a simplified, schematic view.

In FIG. 1 a measuring and sorting arrangement 1 is shown for classifying resistors 2 according to their resistance values.

The measuring and sorting arrangement 1 comprises a measuring station 3 for measuring the resistance value of the resistor 2. The measuring station is formed by a holding device 4 and a measuring device 5, which can be separate from one another, whereby the holding device 4 is connected to the measuring device 5 by at least one line 6.

The holding device 4 for contacting the resistor 2 is arranged in a temperature regulating device 7, whereas in a separate design of the measuring station 3 the measuring device 5 can be arranged outside the temperature regulating device 7.

The temperature regulating device 7 is formed by a holding tank 8, filled with a liquid, non-conductive medium 9. For this the holding device 4 is arranged in the temperature regulating device 7, so that the latter is surrounded completely with medium 9, i.e. the level of the liquid medium 9 lies above the holding device 4. Furthermore, the temperature regulating device 7 comprises a control and/or regulating device 10 for controlling or regulating the temperature of the medium 9. In order to heat the medium 9 the temperature regulating device 7 comprises at least one heating device 11, by means of which the medium 9 can be heated with an input of energy to a preadjustable nominal temperature or can be kept at the corresponding nominal temperature. Of course, it is possible that any design of the temperature regulating device 7 can be used with a liquid medium 9.

Furthermore, in the temperature regulating device 7 a feed and transport device 12 can be arranged, so that the resistor 2 can be conveyed by an external feed device 13, via the feed and transport device 12 to the holding device 4. The feed and transport device 12 is formed by a disc 14. The disc 14 comprises slots 15 around the periphery into which the resistors 2 can be filled or inserted by the feed device 13, whereby on a rotation of the disc 14 the resistors 2 are transported to the holding device 4. Furthermore, the disc 14 has an opening 16 which is arranged offset relative to the slot 15 by 90°. By means of the arrangement of the opening 16 it is possible that the holding device 4 can be contacted via contact pins 17 with the resistors 2, whereby the latter penetrate through the opening 16 into the disc 16 and thus form a contact with the resistor 2, so that by means of the measuring device 5 a measurement of the resistance value can be made at a predetermined temperature.

The disc 14 is positioned by a shaft 18 in the holding tank 8 of the temperature regulating device and projects at least partly into the medium 9 of the temperature regulating device 7. In order that the disc 14 can convey the individual resistors 2 from the feed device 13 to the holding device 4, the disc 14 is driven by a stepping motor 19, which is coupled to the shaft 18.

In order that the position of the individual slots 15 can be detected by a control device 20, a zero point device 21 is arranged in the region of the disc 14. The zero point device 21 is formed by a zero point sensor 22 and a contact 23 arranged on the discs 14. If now due to the drive of the stepping motor 19 the contact 23 moves past the zero point sensor 22 or the contact 23 and the zero point sensor 22 lie opposite one another, the control device 20 due to a signal from the zero point sensor 22 can recognise that a special slot 15 of the disc 14, in particular the first slot 15 has reduced the zero point sensor 22, as a result of which the remaining positions of the individual slots 15 can be calculated by the control device 20.

In order that a measurement of the resistor 2 can be performed by the holding device 4, the holding device 4 is arranged in the holding tank 8 such that the holding device 4 is held by a retaining device 24 in a predeterminable position relative to an opening 16 of the disc 14 so that the contact pins 17 can penetrate into the openings 16 of the disc 14. The retaining device 24 can have any design, whereby it has to be taken into account that with the arrangement of the retaining device 24 an exact position must be determined for the holding device 4.

So that a measured resistor 2 can be removed from the disc 14, in particular from the slots 15 an output device 25 is arranged in the upper region i.e. outside the medium 9. The output device 25 can be formed for example by a simple sorting device 26 known from the prior art. Afterwards several outputs are arranged on the output device 25, in particular on the sorting arrangement 26, by means of which the individual resistors 2 can be released into various containers 27 to 29, which correspond for example to different measurement ranges 30 to 32 for the resistors 2.

The individual components of the measuring and sorting arrangement 1 are connected by several lines 33 to the control device 20, whereby however for the sake of clarity only one line 33 is shown. Via this line 33 individual commands or data are conveyed from the control device 20 to the individual components of the measuring and sorting arrangement 1 or the individual measurement results or processes are transmitted from the individual components to the control device 20. The control device 20 can for example be formed by a conventional microprocessor circuit belonging to the prior art or by a personal computer.

At the beginning of the measuring and/or sorting arrangement 1 the temperature regulating device 7 is first activated by the control device 20. For this it is possible that via the line 33 from the control device 20 a corresponding set value for the nominal temperature is transmitted to the control and/or regulating device 10 of the temperature regulating device 7. Afterwards the heating device 11 is charged with energy by the control and/or regulating device 10 so that the medium 9 which is located in the holding tanks 8 is heated to the preset nominal temperature. This is necessary because the measurement of the individual resistors 2 is performed in the nominal temperature range, i.e. the resistor 2 is heated by the arrangement of the feed and transport device 12, in particular the disc 14 in the medium 9, to the preset nominal temperature, so that a measurement of the resistance value of the resistor 2 occurs in the nominal temperature range. Once the medium 9 has been heated to the preset nominal temperature from the control and/or regulating device 10 via the line 33 a return signal is sent to the control device 20, so that the measuring and/or sorting arrangement 1 can be activated to measure the resistor 2.

Once the temperature device 7 has been heated to the preset nominal temperature the feed device 13 is activated by the control device 20 so that a resistor 2 is moved into the slot 15 of the disc 14. For this the feed device 13 comprises a feed limiting module 34. The feed limiting module 34 can for example be formed by a vibrator, by means of which several resistors 2 can be transported into the feed limiting module 34 and afterwards the resistors 2 are released individually to the disc 14 or the feed and transport device 12. The feed device 13 can be driven for example to release the individual resistors 2 via the control device 20, i.e. for example on powering the stepping motor 19 by the control device 20 the feed device 13 is activated simultaneously, so that by the latter a resistor 2 is brought to the disc 14.

Once a resistor 2 has been delivered by the feed device 13 to the feed and transport device 12, the stepping motor 19 is powered by the control device 20. By driving the stepping motor 19 the disc 14 is moved according to an arrow 35 so that a further slot 15 of the disc is positioned in the transition region to the feed device 13. Afterwards a command to release a resistor 2 is made by the control device, whereby a further resistor 2 is transferred by the feed device 13, in particular by the feed limiting module 34 to the disc 14. This procedure is repeated until the first resistor 2 has reached the holding device 4 of the measuring station 3.

So that the control device 20 can recognise the individual positions of the resistors 2 in the slots 15 of the disc 14, by means of the zero point device 21 before the start of the measurement cycle or filling the disc 14 an initialising of the disc 14 is performed. This can be performed for example in that the disc 14 is driven by the stepping motor 19 until the contact 23 for the zero point sensor 22 is reached on the zero point sensor 22, as a result of which by the zero point sensor 22 a signal is sent to the control device 20. Afterwards by the control device 20 any slot 15 of the disc 14 can be calculated, as due to the drive of the stepping motor 19 the exact position of the first slot 15 can be calculated by the control device 20 by the individual pulses to the stepping motor 19.

Once the disc 14 of the feed and transport device 12 has been filled with resistors 2 by the feed device 13, until the first resistor 2 has reached the region of the holding device 4, a pulse is sent to the measuring station 3 by the control device 20. By activating the measuring station 3 a measurement of the resistance value of the resistor 2 is performed. For this by the measuring station 3 the holding device 4 is activated via the line 6 so that the individual contact pins 17 of the holding device 4 are brought into contact with the resistor 2. For this the holding device 4 is designed so that on both sides of the disc 14 two holding arms 36, 37 are arranged, on which the individual contact pins 17 are arranged. The two holding arms 36, 37 are connected together by a guide shaft 38. On activating the holding device 4 the holding arms 36, 37 are moved along the guide shaft 38 in the direction of the disc 14, so that the contact pins 17 penetrate through the opening 16 into the disc 14, as a result of which the resistor 2 is contacted by the contact pins 17. It is possible in this way that at least one contact pin 17 is arranged on each holding arm 36, 37. In order that an exact measurement of the resistor 2 can be performed, it is advantageous if at least four contact pins 17 are used for measuring the resistance value of the resistor 2. For this two contact pins 17 are arranged on one holding arm 36, 37.

Once the holding device 4 has been contacted by the resistor 2 the resistance value of the resistor 2 is measured by the externally arranged measuring device 5. The measuring of the resistance value of the resistor 2 can be performed by any method known from the prior art. The measurement result is afterwards transferred via a line 39 to an evaluation unit 40. It is possible in this case that the evaluation unit 40 is arranged directly in the control device 20.

Once the measured resistance value of the resistor 2 has been transmitted to the evaluation unit 40 by the control device 20 or by the evaluation unit 40 a variance comparison is performed, i.e. the measured resistance value is compared with a set value predetermined in the control device 20. Afterwards the percentage difference of the measured resistance value from the predetermined set value is determined.

By measuring the resistance value at nominal temperature it is assured that said resistors 2 have an exact value at a corresponding temperature. The area of use of such resistors 2 is for example in air conditioning systems or temperature controlled regulating and/or control devices, which at a specific temperature have to perform a regulating process or control process, whereby to activate the control or regulation a resistance assigned to this temperature is used with the resistor 2 contained therein.

Once the evaluation has been completed in the evaluation unit 40 or in the control device 20, the stepping motor 19 is activated so that the disc 14 is rotated according to the arrow 35 about a position. By the control device 20 the previously measured resistance value or the percentage difference with the position of the slot 15 of the disc 14 is stored in a memory. In this way it is possible that with every drive of the stepping motor 19 by the control device 20 the position is also changed in the memory. With a correspondence of a position of a slot 15, in which a measured resistor 2 is already located, with the output device 25 the output device 25 is activated by the control device 20 and at the same time the corresponding data of the resistor 2 is transferred to the output device 25. By storing the measured resistance values or the percentage difference with the position of the slot 15 of the disc 14 it is possible that several measurement procedures are performed with the measuring station before the first resistor 2 is removed from the feed and transport device 12.

If the position of the slot 15 corresponds with a resistor 2 arranged therein the output device 25 or the sorting arrangement 26 is activated by the control device 20. In this way the resistor 2 is removed from the slot 15 of the disc 14. This can be performed for example by a vacuum device. At the same time as driving the control of the output device 25 or sorting device 26, by the control device 20 the data stored for this resistor 2 is communicated i.e. by the control device 20 the percentage difference of the measured resistor 2 is sent to the output device 25 or to the sorting device 26. By the sorting device 26 the resistor 2 according to the transferred data is conveyed to a corresponding container 27 to 29. The individual containers 27 to 29 correspond to different ranges, in particular measurement ranges 30 to 32 of the percentage difference, i.e. for example the resistors 2 with only 1% difference are allocated to container 27, the resistors 2 with 3% difference are allocated to container 28 and the resistors 2 with none of the above measurement ranges 30, 31 are allocated to container 29.

The advantage of such a measuring and sorting arrangement 1 is that the measurement of the resistance value is performed at a nominal temperature, whereby to heat the resistor 2 to the nominal temperature this is performed by a medium 9, by means of which external influences such as for example the air humidity or the external temperature need not be considered and thus an exact measurement can be performed.

Furthermore, it is possible that with such a measuring and sorting arrangement 1 in front of the output device 25 or after the latter a processing device 41 is arranged as shown schematically by dashed lines. The processing device 41 has the task, on the non-correspondence of the resistance value with the corresponding set value of removing the resistor 2 from the disc 14 and processing it so that the resistance value is adapted to the corresponding set value. For this by the control device 20 on correspondence of the position of the slot 15 with the position of the processing device 41 the processing device 41 is activated so that the resistor 2 is removed from the disc 14 and in the processing device 41 is adjusted to the set value by machining or heat treatment for example by a laser or by adding body mass. For this firstly the body mass of the resistor 2 is detected by the processing device 41 for example by an image processing system. The data is then transferred to a logic module of the processing device 41.

At the same time as activating the processing device 41 the percentage difference is sent to the logic module by the control device 20 so that the latter can calculate a correction factor in relation to the body mass of the resistor body 2. By mechanical or heat processing of the resistor 2 afterwards the resistor 2 is adjusted to the set value either by adding or removing body mass.

Once the resistor 2 has been processed by the processing device 41, the resistor is transferred again into the same or another slot 15 of the disc 14 such that the resistor is returned to the measuring station 3. At the measuring station 3 the resistance value of the resistor 2 is measured again by the measuring device 5. This procedure can be performed several times. Of course, it is possible that a maximum number of cycles of a resistor 2 can be set so that on reaching the maximum cycle of, for example, 3 cycles the resistor 2 is put into the container 29 containing the rejects.

In the example described above it is possible to form the disc 14 from several individual discs joined together, whereby the individual discs are designed so that for example the middle individual disc defines the slots 15 and the two outer individual discs comprise the openings 16. The individual discs are afterwards joined together so that the resistors 2 can be transferred into the slots 15 by the feed device 13.

It is also possible that to identify the slots 15 on the disc 14 for each slot 15 an identification signal, in particular a barcode is arranged, so that by means of a corresponding reading device the slot 15 can be identified. In this case for example each of the components connected with the feed and transport device 12 has its own reading device. In this way it is possible that the individual components after the reading procedure can read the data for the resistor 2 located in the slot 15 from a central memory and can perform the individual control sequences according to the data. Of course, it is possible for there to be only one reading device, by which each position of the slot 15 can be calculated by the control device 20 or by each separated component.

It is also possible that to establish a resistor 2 in a slot 15 the disc 14 can have an optical recognition device to which the control device 20 is connected. The optical recognition device can be designed so that on one side of the disc 14 a transmitter is arranged and on the opposite side a receiver. In order to establish whether there is a resistor 2 in the slot 15 a light signal is emitted through one of the openings 16 of the disc 14 by a transmitter, whereby on the arrival of the light signal at a receiver the recognition device sends for example a signal to the control device 20, so that the control device 20 can recognise that in this slot 15 of the disc 14 there is no resistor 2. Of course, to recognise the resistor 2 in the slot 15 also a mechanical recognition device can be used which is formed for example by a sensor.

It is also possible that the resistors 2 are contacted automatically in the feed and transport device 12, so that the openings 16 for the slots 15 can be omitted. For this contact points are arranged in the slots 15 which on filling a slot 15 with a resistor 2 contact automatically. The contact points can for example be drawn outwards by lines integrated into the discs 14, so that contact for measuring the resistor 2 is performed on the outside of the disc 14 via the holding device 4.

In FIG. 4 a further embodiment of the measuring and/or sorting arrangement 1 is shown, whereby here only the temperature regulating device 7 is shown in front elevation, in cross section.

In the embodiment shown the feed and transport device 12, in particular the disc 14 is arranged on the shaft 18 in the inner chamber of the temperature regulating device 7. The feed and transport device 12 projects partly into the non-conductive medium 9 of the temperature regulating device 7.

Figure 2:
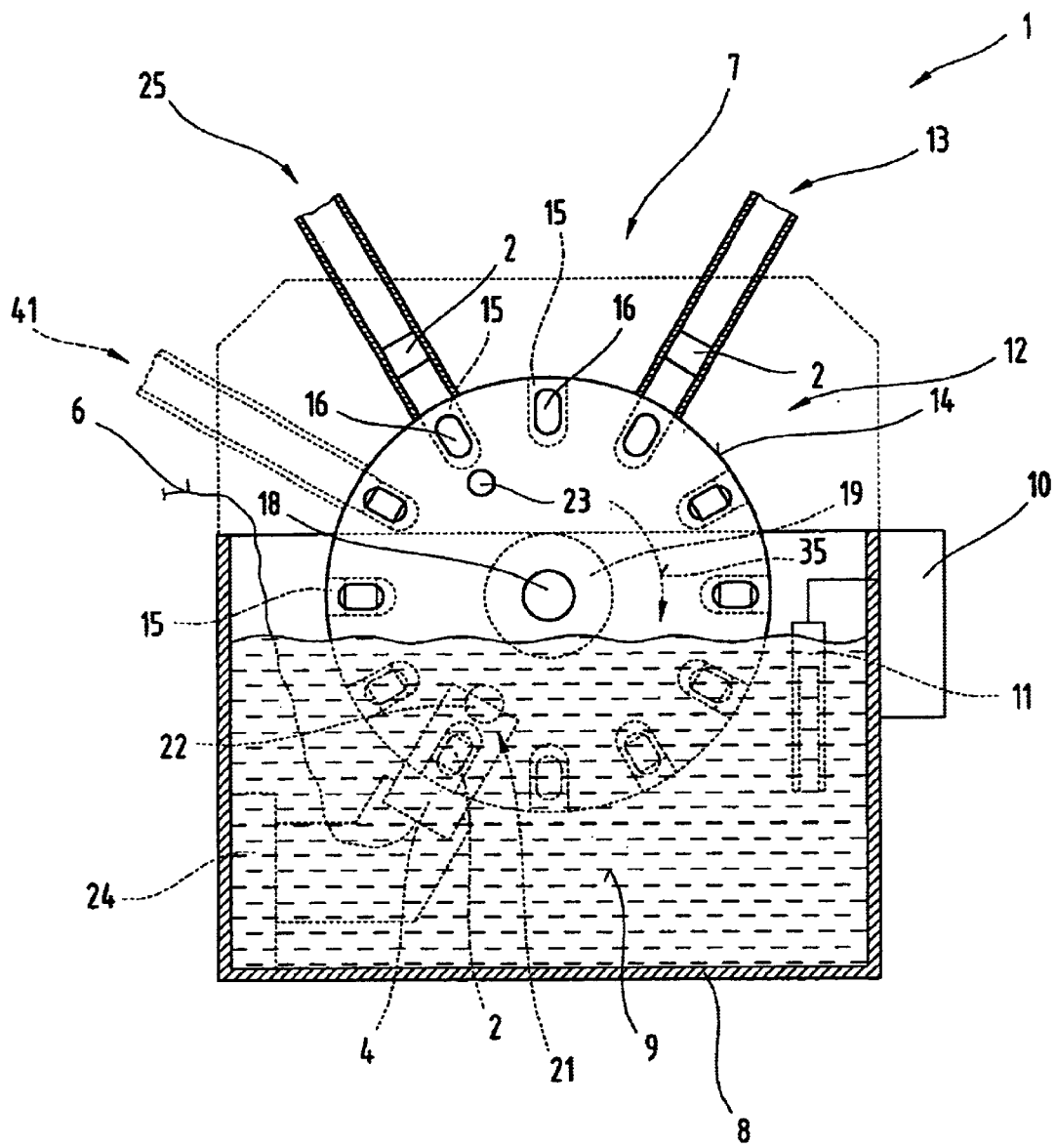
FIG. 2 a temperature regulating device of the measuring and sorting arrangement according to the invention in a simplified, schematic view and side view, in cross section.

According to the FIGS. 1 to 3 described above the holding device 4 of the measuring station 3 is arranged on the inside of the holding tank 8 of the temperature regulating device 7, whereby the medium 9 again fully surrounds the holding device 4.

The difference from the embodiment described above is that in the temperature regulating device 7 a further feed and transport device 42 is arranged in the temperature regulating device 7. The feed and transport device 42 is in turn formed by a disc 43 with a slot 44 located therein and an opening 45. The additional feed and transport device 42, in particular the disc 43 is in turn allocated a holding device 46.

The function of this embodiment corresponds to the function described in FIGS. 1 to 3, whereby here instead of a feed device 13 and an output device 25 or a processing device 41, for every disc 14, 43 a separate feed device 13, output device 25 or processing device 41 is arranged. The disc 43 is also arranged on the shaft 18 so that by activating the stepping motor 19 both discs 14, 43 are moved in the same rhythm. In this way it is possible that only a zero point device 21 has to be used, whereby the latter is positioned in the shown embodiment in the region of the disc 14. Of course, it is possible that the zero point device 21 can be arranged in the region of the disc 43. It is also possible that the disc 43 can be on a separate shaft 18 with a stepping motor 19 allocated to this shaft 18, so that the two discs 14, 43 can be operated independently of one another. For this it is necessary however that for every disc 14, 43 a zero point device 21 or a different device is allocated for identifying the slots 15, 44, for example a barcode reading device.

The advantage of such an arrangement of several discs, in particular two discs 14, 43 in the temperature regulating device 7 is that in one measurement cycle two resistors 2 can be measured simultaneously. Of course, it is possible that more than only two feed and transport devices 12, 42 in particular discs 14, 43 can be arranged in the temperature regulating device 7, whereby for each feed and transport device 12, 42 a feed device 13, an output device 25 or a processing device 41 can be arranged.

It is also possible however that only one feed device 13, one output device 25 or one processing device 41 can be arranged for several discs 14, 43, whereby the latter are operated by guides parallel to the individual discs 14, 43, so that a serial filling of the feed and transport device 12, 42 or a serial measuring, processing or removal of the resistors 2 can be performed.

Figure 5:
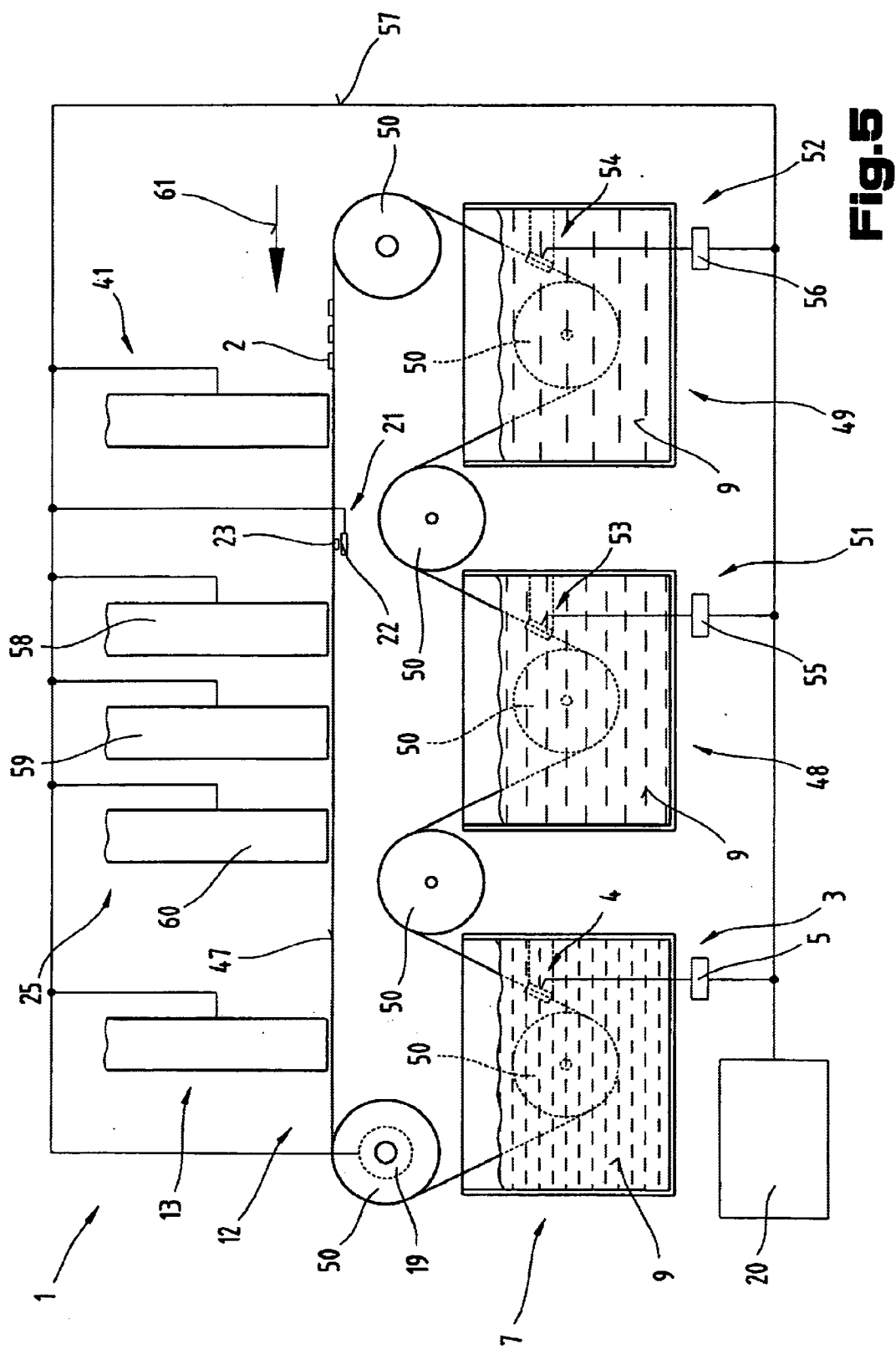
FIG. 5 a further embodiment of the measuring and sorting arrangement, in a simplified, schematic view.

In FIG. 5 a further embodiment of the measuring and sorting arrangement 1 is shown. In the shown embodiment the feed and transport device 12 is formed by a transport band 47 or by a transport belt. The transport band 47 can be constructed so that it corresponds to an open Plister belt i.e. in the transport band 47 there are recesses in which the resistors 2 are placed by the feed device 13, so that transport of the resistors 2 is possible. It is of course possible that instead of the transport band 47 a Plister belt into which the resistors 2 or the resistances are integrated, can be fixed into the measuring and sorting arrangement 1.

In such measuring and sorting arrangements 1 several temperature regulating devices 7, 48, 49 are arranged, which are connected together by the transport band 47, i.e. the transport band 47 extends from the temperature regulating device 7 over rollers 50 into the other temperature regulating devices 48, 49, whereby afterwards the transport band 47 extends back over additional rollers 50 to the temperature regulating device 7 and thus closes the circle. In addition in each temperature regulating device 7, 48, 49 there is a separate measuring station 3, 51, 52 which is formed by a holding device 4, 53, 54 and a measuring device 5, 55, 56. The individual measuring devices 5, 55, 56 or the measuring stations 3, 51, 52 are connected by a bus system 57 to the control device 20. The bus system 57 can be formed by any serial or parallel bus system belonging to the prior art. Of course it is possible that the components used in this embodiment are connected directly to the control device 20.

Furthermore, the transport band 47 is assigned the feed device 13, the processing device 41 and the output device 25, which is now formed by three outputs 58 to 60. As shown schematically the individual components of the feed device 13, the output device 25 and the processing device 41 are also connected by the bus system 57 to the control device 20. Furthermore, the zero point device 21 is arranged on the transport band 47 whereby the zero point device is formed in turn by the contact 23 and the zero point sensor 22.

On the start up of such a measuring and sorting arrangement 1 basically the same functional sequence is performed as in the above described FIGS. 1 to 4, whereby first the medium 9 of the individual temperature regulating devices 7, 48, 49 is heated to a presettable nominal temperature. In this embodiment the media 9 of the individual temperature regulating devices 7, 48, 49 are heated to different nominal temperatures.

For this by the control device 20 via the bus system 57 belonging to the prior art a control signal is sent to the feed device 13, whereby by a resistor 2 is positioned on the transport band 47. Afterwards the stepping motor 19 which is also connected by the bus system 57 to the control device is driven by the control device 20 so that the transport band is moved in the direction of an arrow 61. Afterwards by the control device 20 in turn the feed device 13 is charged with a signal, whereby the next resistor 2 is positioned on the transport band 47. This procedure of positioning the resistors 2 is performed until the first resistor 2 has reached the first measuring station 3 in particular the holding device 4. Afterwards as in the Figures described above a measuring procedure is performed in the non-conductive medium 9 at a nominal temperature. Once the evaluation has been performed by this measuring process by the control device 20 the stepping motor 19 is again powered with a pulse so that this resistor 2 moves further in the direction of the next temperature regulating device 47 and a new resistor 2 is positioned on the transport band 47 by driving the feed device 13.

By the arrangement of several temperature regulating devices 7, 48, 49 it is possible for the individual temperature regulating devices 7, 48, 49 to have different nominal temperatures, whereby a measurement of the resistor 2 can be performed at different nominal temperatures.

Once a measurement of a resistor 2 has been performed by the measuring station 3, in particular the measuring device 5, the measurement result is conveyed by the bus system 57 to the control device 20. If a resistor 2 has run through all temperature regulating devices 7, 48, 49 and thus all measuring stations 3, 51, 52 on the correspondence of the position with the processing device 41 by the control device 20 a signal is sent to the processing device 41 via the bus system 57. Then by the processing device 41 the resistor 2 is removed from the transport band and via an image processing device the body mass of this resistor 2 is detected. At the same time with the activation of the processing device 41 the percentage difference of this resistor 2 from the control device 20 is transmitted to the processing device 41. By means of detecting the body mass and the transmitted percentage difference of this resistor 2, now by the processing device 41 the processing of the resistor 2 can be performed. For this it is possible as in the previously described Figures that different methods or devices belonging to the prior art can be used for processing resistors 2. It is possible for example that by machining or heat treatment for example by a laser or by applying body mass the resistance value can be adjusted to the prespecified set value.

Once the processing of the resistor 2 has been performed the resistor 2 is again positioned on the transport band 47. It is possible that the resistor 2 is placed into the same recess of the transport band 47 or in a different recess of the transport band 47, whereby before positioning the resistor 2 the control device 20 is contacted by the processing device 41 so that the control device 20 sends a free signal for placing on the transport band 47 via the bus system 57 of the processing device 41. This is necessary because due to the large number of different positions on the transport band 47 the control device 20 has to calculate the position of each individual resistor 2 on the transport band 47 as for the placing or for the output device 25 a corresponding pulse has to be generated.

However once the resistor 2 has been processed by the processing device 41 the resistor 2 must run through the measuring stations 3, 51, 52 before it can be removed by the output device 25 from the transport band 47. If a resistor 2 corresponds with the prespecified tolerance ranges the output device 25 is activated. It is possible then that the removal of the resistor 2 via the three outputs 58 to 60 is controlled by the control device 20. The three outputs 58 to 60 of the output device 25 have the task of placing the resistor 2 according to tolerance range into the different containers. It is possible for example that output 58 is used for resistors 2 which only have a 1% difference, whereas for example output 59 can be used for resistors 2 with a 3% difference and output 60 for resistors 2 with 5% difference.

The exact description of the function of the measuring procedure or the removal or processing and the feeding of the resistors 2 can be taken from FIGS. 1 to 3.

The advantage of such a measuring and sorting arrangement 1 is that the resistor 2 can be measured at different nominal temperatures. For this the individual temperature regulating devices 7, 48, 49 are heated to different temperatures so that a temperature curve can be produced with a corresponding resistance value for each resistor 2.

It is possible of course that resistors 2 can be arranged in parallel on the transport band 47. For this for each resistor 2 a separate holding device 4, 53, 54 or a joint holding device 4, 53, 54 can be arranged which can be moved on guides. The contacting of the resistors 2 by the holding device 4, 53, 54 is performed as in FIGS. 1 to 3 described above via the contact pins 17.

It is also possible of course that for the individual measuring stations 3, 51, 52 independent control devices 20 can be arranged. These individual control devices 20 are afterwards connected by lines or a bus system 57 so that a corresponding data exchange can be performed. It is also possible that after each temperature regulating device 7, 48, 49 a separate processing device 41 or output device 25 is arranged, so that after running through one or more temperature regulating devices 7, 48, 49 the resistor 2 can be removed from the transport band 47. It is also possible that several adjacent transport bands 47 are arranged in the individual temperature regulating devices 7, 48, 49 whereby in this case only one measuring station 3, 51, 52 or an independent measuring station 3, 51, 52 is arranged. It is also possible that the holding device 4, 53, 54 is designed such that several adjacent resistors 2 can be contacted in one working stage.

For form's sake it should be mentioned that in the drawings individual components and component groups are shown schematically for a better understanding of the invention. These individual components or component groups can be formed by any device known from the prior art.

Individual features of the individual embodiments can also be combined with other individual features of other embodiments or alone can represent the subject matter of independent inventions.

Principally the individual designs shown in FIGS. 1 to 3; 4; 5 can form the subject matter of independent solutions according to the invention. The objectives and solutions according to the invention are to be taken from the detailed descriptions of these Figures.

List of Reference Numbers

1. Measuring and sorting arrangement
2. Resistor
3. Measuring station
4. Holding device
5. Measuring device
6. Line
7. Temperature regulating device
8. Holding tank
9. Medium
10. Regulating and/or control device
11. Heating device
12. Feed and transport device
13. Feed device
14. Disc
15. Slot
16. Opening
17. Contact pin
18. Shaft
19. Stepping motor
20. Control device
21. Zero point device
22. Zero point sensor
23. Contact
24. Retaining device
25. Output device
26. Sorting device
27. Container
28. Container
29. Container
30. Measurement range
31. Measurement range
32. Measurement range
33. Line
34. Feed limiting module
35. Arrow
36. Holding arm
37. Holding arm
38. Guide arm
39. Line
40. Evaluation unit
41. Processing device
42. Feed and transport device
43. Disc
44. Slot
45. Opening
46. Holding device
47. Transport band
48. Temperature regulating device
49. Temperature regulating device
50. Roller
51. Measuring station
52. Measuring station
53. Holding device
54. Holding device
55. Measuring device
56. Measuring device
57. Bus system
58. Output
59. Output
60. Output
61. Arrow

What is claimed is:

1. Measuring and sorting arrangement for measuring and sorting resistance values of resistors, comprising a feed and transport device for the resistors, a measuring station and an output device arranged thereafter, and a temperature regulating device comprising a holding tank filled with a liquid medium, wherein the measuring station is arranged in the temperature regulating device and the position of the resistors on the feed and transport device is determined by a zero point device.

2. The measuring and sorting arrangement according to claim 1, wherein the feed and transport device comprises a disc and slots are provided in the disc into which the resistors can be inserted by a feed device.

3. The measuring and sorting arrangement according to claim 2, wherein the disc projects at least partly into the temperature regulating device.

4. The measuring and sorting arrangement according to claim 2, wherein the disc is formed by several individual discs.

5. The measuring and sorting arrangement according to claim 2, wherein the disc is driven by a stepping motor, and where the zero point device for determining the position of the resistors located individually in the slots is formed by a zero point sensor and a contact.

6. The measuring and sorting arrangement according to claim 2, wherein the slots of the disc have openings offset by 90°, via which a holding device can be contacted with the resistor.

7. The measuring and sorting arrangement according to claim 6, wherein the holding device comprises at least two contact pins.

8. The measuring and sorting arrangement according to claim 1, wherein the temperature regulating device comprises a control and regulating device for monitoring the temperature and at least one heating device for heating the medium.

9. The measuring and sorting arrangement according to claim 1, wherein several parallel arranged feed and transport devices in the form of discs are arranged, and further comprising a holding device assigned to each disc.

10. The measuring and sorting arrangement according to claim 1, wherein the feed and transport device is formed by a transport belt.

11. The measuring and sorting arrangement according to claim 10, wherein the feed and transport device is designed so that by means of the feed and transport device several adjacent temperature regulating devices are connected.

12. The measuring and sorting arrangement according to claim 11, wherein at least in each temperature regulating device a measuring station is arranged, whereby at a first of the measuring stations the feed device is arranged and at a last of the measuring stations the output device is arranged.

13. The measuring and sorting arrangement according to claim 12, wherein the individual measuring stations are connected to a joint or with several control devices.

14. The measuring and sorting arrangement according to claim 11, wherein in the region of each temperature regulating device or each measuring station an output device is arranged.

15. The measuring and sorting arrangement according to claim 10, wherein several output devices are provided.

16. The measuring and sorting arrangement according to claim 10, wherein on the transport belt several adjacent resistors are positioned.

17. The measuring and sorting arrangement according to claim 16, wherein for each adjacent resistor on the transport belt a separate holding device is provided.

18. The measuring and sorting arrangement according to claim 16, wherein a holding device is arranged so that several adjacent resistors can be contacted by the holding device.

19. The measuring and sorting arrangement according to claim 1, wherein the output device is formed by a sorting device.

20. A method for measuring and sorting resistors according to resistance values thereof, the method comprising:

transporting a resistor on a feed and transport device to a measuring station located in a medium of a temperature regulating device;

controlling the temperature of the medium of the temperature regulating device such that the resistor in the measuring station is forced to be at a predetermined nominal temperature;

contacting the resistor in the medium at the measuring station so as to measure a resistance value of the resistor at the predetermined nominal temperature;

determining a position of the resistor on the feed and transport device via a zero point device; and transporting the resistor from the measuring station on the feed and transport device to an output device that removes the resistor and delivers the resistor sorted according to predetermined measurement ranges.

* * * * *